(12) United States Patent
Morgan

(10) Patent No.: US 7,077,975 B2
(45) Date of Patent: Jul. 18, 2006

(54) METHODS AND COMPOSITIONS FOR REMOVING GROUP VIII METAL-CONTAINING MATERIALS FROM SURFACES

(75) Inventor: Paul A. Morgan, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 10/215,215

(22) Filed: Aug. 8, 2002

(65) Prior Publication Data

US 2004/0025904 A1   Feb. 12, 2004

(51) Int. Cl.
| | |
|---|---|
| B44C 1/22 | (2006.01) |
| C03C 25/68 | (2006.01) |
| C03C 15/00 | (2006.01) |
| C23F 1/00 | (2006.01) |
| C25F 3/00 | (2006.01) |

(52) U.S. Cl. ................................... 216/108
(58) Field of Classification Search ............... 216/99, 216/100, 108, 38, 52, 88, 89, 90, 91, 92; 438/753, 754, 691, 692, 693
See application file for complete search history.

(56) References Cited

U.S. PATENT DOCUMENTS

| | | | |
|---|---|---|---|
| 4,078,963 A | 3/1978 | Symersky | |
| 4,902,379 A | 2/1990 | Rhodes | |
| 5,102,499 A | 4/1992 | Jodgens et al. | |
| 5,217,569 A | 6/1993 | Hodgens, II et al. | |
| 5,258,093 A | 11/1993 | Maniar | |
| 5,271,797 A | 12/1993 | Kamisawa | |
| 5,298,280 A | 3/1994 | Kaczur et al. | |
| 5,692,950 A | 12/1997 | Rutherford et al. | |
| 5,695,572 A | 12/1997 | Brunner et al. | |
| 6,006,765 A | 12/1999 | Skrovan et al. | |
| 6,039,633 A | 3/2000 | Chopra | |
| 6,044,851 A | 4/2000 | Grieger et al. | |
| 6,162,301 A | 12/2000 | Zhang et al. | |
| 6,162,738 A | 12/2000 | Chen et al. | |
| 6,245,650 B1 | 6/2001 | Watanabe | |
| 6,431,185 B1 | 8/2002 | Tomita et al. | |
| 6,465,403 B1 | 10/2002 | Skee | |
| 2003/0228762 A1* | 12/2003 | Moeggenborg et al. ..... | 438/691 |

FOREIGN PATENT DOCUMENTS

| | | |
|---|---|---|
| WO | WO 98/04646 | 2/1998 |
| WO | WO 98/06541 | 2/1998 |

OTHER PUBLICATIONS

Akiya, "Thin-Oxide Dielectric Strength Improvement by Adding a Phosphonic Acid Chelating Agent into $NH_4OH-H_2O_2$ Solution," *J. Electrochem. Soc.*, Oct. 1994; 141(10):L139-L142.

(Continued)

*Primary Examiner*—Parviz Hassanzadeh
*Assistant Examiner*—Roberts Culbert
(74) *Attorney, Agent, or Firm*—Mueting, Raasch & Gebhardt, P.A.

(57) ABSTRACT

A method and composition for removing Group VIII metal-containing materials from a surface (preferably, a platinum-containing, and more preferably, a platinum-rhodium-containing surface) involves the use of a mixture of phosphoric acid, sulfuric acid, nitric acid, and hydrochloric acid.

32 Claims, 1 Drawing Sheet

OTHER PUBLICATIONS

Wolf and Tauber, "*Silicon Processing for the VLSI Era, Volume 1: Process Technology,*" Sunset Beach, California, 1986; 519-20.

Gordon and Ford, "Properties of Molecular Systems," *The Chemist's Companion—A Handbook of Practical Data, Techniques, and References,* John Wiley & Sons, New York, NY, 1972: 58, 59, 77.

Shriver et al., "Inorganic Chemistry," Second Edition, 1994:187-188.

* cited by examiner

METHODS AND COMPOSITIONS FOR REMOVING GROUP VIII METAL-CONTAINING MATERIALS FROM SURFACES

FIELD OF THE INVENTION

The present invention relates to methods for removing Group VIII metal-containing materials (preferably, platinum-containing, and more preferably, platinum-rhodium-containing materials) from surfaces, particularly in the fabrication of semiconductor devices.

BACKGROUND OF THE INVENTION

Films of metals and metal oxides, particularly the heavier elements of Group VIII, are becoming important for a variety of electronic and electrochemical applications. This is at least because many of the Group VIII metal films are generally unreactive, resistant to diffusion of oxygen and silicon, and are good conductors. Oxides of certain of these metals also possess these properties, although perhaps to a different extent.

Thus, films of Group VIII metals and metal oxides, particularly the second and third row metals (e.g., Ru, Os, Rh, Ir, Pd, and Pt) have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors.

Platinum is one of the candidates for use as an electrode for high dielectric capacitors. Capacitors are the basic charge storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs). Thus, there is a continuing need for methods and materials for the deposition of Group VIII metal-containing films, preferably, platinum-containing films.

Many surfaces that result during the formation of Group VIII metal-containing films, particularly in the wafer fabrication of semiconductor devices, do not have uniform height, and therefore, the wafer thickness is also non-uniform. Further, surfaces may have defects such as crystal lattice damage, scratches, roughness, or embedded particles of dirt or dust. For various fabrication processes to be performed, such as lithography and etching, height non-uniformities and defects at the surface of the wafer must be reduced or eliminated. Various planarization techniques are available to provide such reduction and/or elimination. One such planarization technique includes mechanical and/or chemical-mechanical polishing (abbreviated herein as "CMP").

The process of planarization is used to remove material, and preferably achieve a planar surface, over the entire chip and wafer, sometimes referred to as "global planarity." Conventionally, the process of planarization, and particularly CMP, involves the use of a wafer holder that holds a wafer, a polishing pad, and an abrasive slurry that includes a dispersion of a plurality of abrasive particles in a liquid. The abrasive slurry is applied so that it contacts the interface of the wafer and the polishing pad. A table or platen has a polishing pad thereon. The polishing pad is applied to the wafer at a certain pressure to perform the planarization. At least one of the wafer and a polishing pad are set in motion relative to the other. In some planarization processes, the wafer holder may or may not rotate, the table or platen may or may not rotate and/or the platen may be moved in a linear motion as opposed to rotating. There are numerous types of planarization units available which perform the process in different manners. Alternatively, the polishing pad and abrasive slurry may be replaced by a fixed abrasive article that includes a plurality of abrasive particles dispersed within a binder adhered to at least one surface of a backing material.

The planarization of a surface that includes platinum and other Group VIII metals typically involves mechanical polishing, as opposed to chemical-mechanical polishing, because they are relatively chemically inert and/or have relatively few volatile products. Such mechanical polishing uses alumina and silica particles. Unfortunately, mechanical polishing tends to cause smearing (i.e., undesirable relocation of target material, particularly ductile materials) and the formation of defects (e.g., scratches), both of which can be detected optically, rather than the clean removal of the platinum. Also, many commercially available abrasive slurries do not effectively planarize platinum or other Group VIII metal-containing surfaces either because no material is removed (which results in no change in resistance of the wafer) or the resultant surface has defects therein.

Another process for removing material is etching. Etching is the selective removal of material, either locally by masking an area or over an entire surface without masking, the latter of which is referred to as blanket etching. Typically, wet etching is performed by immersing the substrate in an appropriate solution or by spraying the surface with the etchant solution. Etchants used for platinum include aqua regia (a mixture of nitric acid and hydrochloric acid); however, this does not generally etch alloys of platinum, particularly platinum-rhodium. Compositions that do etch alloys such as platinum-rhodium include compounds that are not compatible with other fabrication processes and/or are difficult to apply. These include $KMnO_4$ and zinc powder, for example.

Thus, there is still a need for methods for planarizing or etching an exposed surface of a substrate that includes Group VIII metals, particularly in the fabrication of semiconductor devices.

SUMMARY OF THE INVENTION

The present invention provides methods that overcome many of the problems associated with the removal of a material from a surface that includes one or more Group VIII metals, preferably platinum and optionally another of the Group VIII metals. Such a surface is referred to herein as a Group VIII metal-containing surface. Preferably, a "Group VIII metal-containing surface" refers to an exposed region having a Group VIII metal (preferably platinum) present in an amount of at least about 50 atomic percent of the composition of the region. More preferably, the surface includes (and most preferably, consists essentially of) platinum in elemental form or an alloy with one or more other Group VIII metals. That is, the surface does not include significant amounts of non-Group VIII metals or nonmetals such as silicon, oxygen, or nitrogen atoms. Most preferably, the surface includes a platinum/rhodium alloy present in an amount of at least about 60 atomic percent platinum and no more than about 40 atomic percent rhodium.

The material may be provided as a layer, film, coating, etc. Preferably, it is removed via planarization (e.g., via chemical-mechanical or mechanical planarization or polishing) or etching, in accordance with the present invention.

The methods of the present invention involve removing the Group VIII metal-containing material using an acidic composition that includes a mixture of phosphoric acid, sulfuric acid, nitric acid, and hydrochloric acid. This mixture can be used in wet etching or planarization processes. The workpiece can be immersed in the acidic composition or the acidic composition can be sprayed on the workpiece.

Preferably, the acidic composition, which can be in the form of an etchant solution or acidic composition, includes a mixture of phosphoric acid, sulfuric acid, nitric acid, and hydrochloric acid. Typically, an amount of each is used in excess of the target material to be removed.

In preferred embodiments, the acidic composition includes phosphoric acid initially in an amount of at least about 10 vol-% and no greater than about 25 vol-%, sulfuric acid initially in an amount of at least about 10 vol-% and no greater than about 50 vol-%, nitric acid initially in an amount of at least about 0.25 vol-% and no greater than about 10 vol-%, and hydrochloric acid initially in an amount of at least about 25 vol-% and no greater than about 50 vol-%. More preferably, the nitric acid is initially present in an amount of at least about 0.25 vol-% and no greater than about 1 vol-%.

The acidic composition can optionally include abrasive particles, thereby resulting in an abrasive slurry, and be used in planarization techniques with conventional polishing pads that do not have abrasive particles embedded therein. Alternatively, the acidic composition without abrasive particles therein can be used with fixed abrasive articles (i.e., abrasive polishing pads) in place of conventional polishing pads. Such fixed abrasive articles include a plurality of abrasive particles dispersed within a binder adhered to at least one surface of a backing material. Whether in a fixed abrasive or in the acidic composition, preferred abrasive particles have a hardness of no greater than about 9 mho. If the acidic composition is not stable in combination with abrasive particles (i.e., an abrasive slurry), they may be provided by separate delivery systems and/or in separate compositions and mixed at the point of use.

Thus, in one aspect of the present invention, a method is provided wherein contacting the Group VIII metal-containing material with an acidic composition involves: positioning the Group VIII metal-containing surface of the substrate to interface with a polishing pad; supplying an acidic composition in proximity to the interface; and planarizing the substrate surface. The acidic composition can include a plurality of abrasive particles and/or the polishing pad can include a plurality of abrasive particles.

As used herein, "semiconductor substrate or substrate assembly" refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as vias, contact openings, high aspect ratio openings, conductive regions, contact regions, etc. For example, a substrate assembly may refer to a structure upon which a metallization is to be performed, e.g., metal lines are formed for electrical interconnection functionality.

Herein, as is conventionally understood, "wet etching" or simply "etching" refers to the removal of material from a surface, whether it be a large or small amount of material, using chemical dissolution. Typically, wet etching is performed by immersing the substrate in an appropriate solution or by spraying the surface with the etchant solution.

Herein, as is conventionally understood, "planarizing" or "planarization" refers to the removal of material from a surface, whether it be a large or small amount of material, either mechanically, chemically, or both. This also includes removing material by polishing. As used herein, "chemical-mechanical polishing" and "CMP" refer to a dual mechanism having both a chemical component and a mechanical component, wherein corrosion chemistry and fracture mechanics both play a roll in the removal of material, as in wafer polishing.

DESCRIPTION OF PREFERRED EMBODIMENTS

Figure 1A:
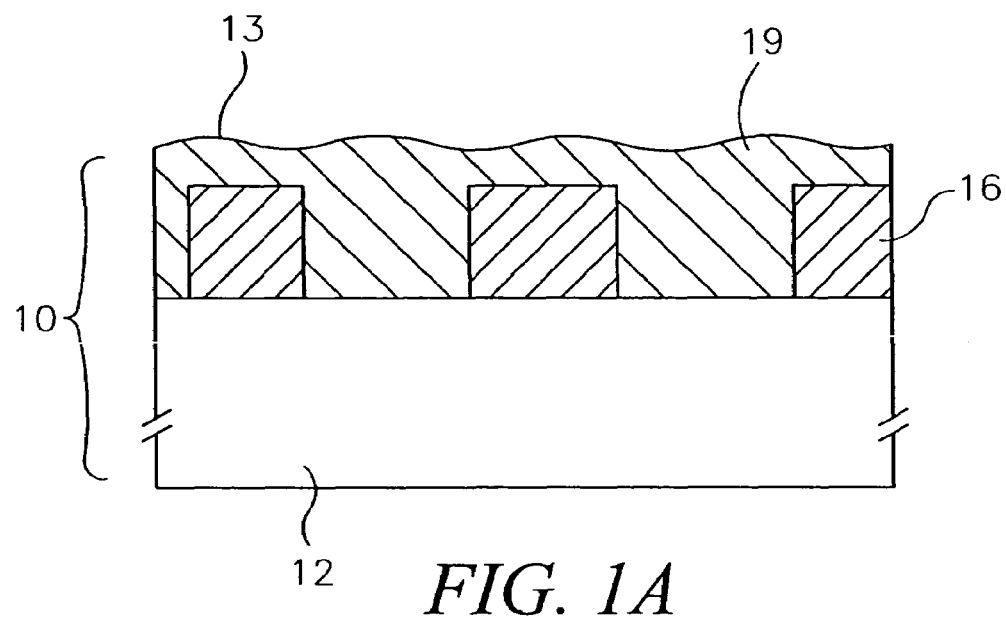
FIGS. 1A and 1B are cross-sectional illustrations of one portion of a wafer before and after an etching or planarization process has been performed in accordance with the present invention.

The present invention provides methods of removing material, either by etching or by planarization, from a surface that includes one or more of the Group VIII metals. The Group VIII metals are also referred to as the Group VIIIB elements or transition metals of Groups 8, 9, and 10 of the Periodic Table, and include the iron triad (Fe, Ru, Os), the cobalt triad (Co, Rh, Ir), and the nickel triad (Ni, Pd, Pt). Such a surface is referred to herein as a Group VIII metal-containing surface.

The planarization of such surfaces, particularly a surface that includes platinum in elemental form, typically involves mechanical methods with relatively hard particles such as alumina ($Al_2O_3$) and silica ($SiO_2$) particles, which can cause smearing and the formation of defects rather than the clean removal of the material. Surprisingly, the use of an acidic composition as described herein in combination with a plurality of abrasive particles in the composition or with a fixed abrasive article reduces, and often eliminates (depending on the processing conditions), the problems of smearing and defect formation. Similarly, the etching of such surfaces using an acidic composition as described herein is much more acceptable and effective than conventional etching solutions.

Significantly, the methods of the present invention are particularly advantageous in removing platinum optionally in combination with other Group VIII metals from a surface in preference to other elements, such as oxides, silicides, and nitrides. This is important in selectively removing material from Group VIII metal-containing layers without removing, for example, significant amounts of underlying layers, such as oxide layers (e.g., TEOS or BPSG layers) and other dielectric layers.

Preferably, the acidic composition, which can be in the form of an etchant solution or acidic composition, includes a mixture of phosphoric acid ($H_3PO_4$), sulfuric acid ($H_2SO_4$), nitric acid ($HNO_3$), and hydrochloric acid (HCl). Each of these acids is typically available in an aqueous solution. Thus, the acidic composition is typically an aqueous composition, whether additional water is added or not. If desired, additional deionized water (e.g., of the level of purity conventionally used in semiconductor processing) can be added.

The acidic composition is defined herein in terms of the amounts of concentrated acids used. Commercially available concentrated reagent-grade phosphoric acid is typically a 14.7 Normal solution and includes about 85 wt-% phosphoric acid. Commercially available concentrated reagent-grade sulfuric acid is typically a 36 Normal solution and includes about 96 wt-% to about 98 wt-% sulfuric acid. Commercially available concentrated reagent-grade nitric acid is typically a 15.9 Normal solution and includes about 70 wt-% nitric acid. Commercially available concentrated reagent-grade hydrochloric acid is typically a 12 Normal solution and includes about 37 wt-% to about 38 wt-% hydrochloric acid.

The phosphoric acid is preferably present in the composition initially (i.e., added as a concentrated solution) in an amount of at least about 10 volume percent (vol-%), and preferably no greater than about 25 vol-%. The sulfuric acid is preferably present in the composition initially (i.e., added as a concentrated solution) in an amount of at least about 10 vol-%, and preferably no greater than about 50 vol-%. The nitric acid is preferably present in the composition initially (i.e., added as a concentrated solution) in an amount of at least about 0.25 vol-%, and preferably no greater than about 10 vol-% (more preferably, no greater than about 1 vol-%, particularly for platinum-rhodium alloys, and most preferably, no greater than about 0.5 vol-%). The hydrochloric acid is preferably present in the composition initially (i.e., added as a concentrated solution) in an amount of at least about 25 vol-%, and preferably no greater than about 50 vol-%. For certain preferred embodiments, the acids are combined as concentrated solutions in amounts as follows: at least about 10 vol-% phosphoric acid, at least about 10 vol-% sulfuric acid, no greater than about 10 vol-% (more preferably, no greater than about 1 vol-%, and most preferably, no greater than about 0.5 vol-%) nitric acid, and at least about 25 vol-% hydrochloric acid. A preferred composition for removing platinum includes $H_3PO_4:H_2SO_4:HCl:HNO_3$ in relative amounts of about 25:25:50:8 by volume of concentrated acids. A preferred composition for removing platinum/rhodium (preferably an alloy of at least 60 atomic percent platinum and no greater than about 40 atomic percent rhodium) includes $H_3PO_4:H_2SO_4:HCl:HNO_3$ in relative amounts of about 25:25:50:0.5 by volume of concentrated acids.

The acidic composition is preferably used at an elevated temperature. Typically, the acidic composition is used at a temperature of at least about 65° C., and preferably, at a temperature of at least about 80° C. Typically, a temperature of no greater than about 100° C. is used. If the temperature is less than about 65° C., the removal rate is typically too slow and nonuniform for practical application. If the temperature is more than about 100° C., the composition is typically too unstable.

Preferably, the acidic composition of the present invention is prepared in a manner to prevent hazardous exotherms. A preferred order of mixing is as follows: phosphoric acid is added to sulfuric acid, which results in an exotherm of about 60° C.; hydrochloric acid is then added to the mixture of phosphoric and sulfuric acids, which cools the mixture down to about 40° C. because of a slight endotherm between the hydrochloric acid and the sulfuric acid; the mixture is then heated to at least about 65° C. and nitric acid is added.

The acidic composition can be used in slurry planarization (i.e., in a conventional planarization process in which the acidic composition includes the abrasive particles with a polishing pad that does not include abrasive particles) or in fixed abrasive planarization. Preferably, slurry planarization is used in the methods of the present invention. Preferably, when used in slurry planarization, the acidic composition (i.e., abrasive slurry) includes the abrasive particles in an amount of about 1% by weight to about 30% by weight, and more preferably, about 1% by weight to about 15% by weight.

A wide variety of abrasive particles can be used either in an abrasive slurry or in a fixed abrasive article. Typically, such abrasive particles range in particle size (i.e., the largest dimension of the particle) on average from about 10 nanometers (nm) to about 5000 nm, and more often about 30 nm to about 1000 nm. For preferred embodiments, suitable abrasive particles have an average particle size of about 100 nm to about 300 nm.

Examples of suitable abrasive particles include, but are not limited to, alumina ($Al_2O_3$), silica ($SiO_2$), ceria ($CeO_2$), yttria ($Y_2O_3$), zirconia ($ZrO_2$), and tantalum pentoxide ($TaO_5$). Preferred abrasive particles include alumina ($Al_2O_3$), silica ($SiO_2$), ceria ($CeO_2$), and zirconia ($ZrO_2$). Various combinations of abrasive particles can be used if desired.

Preferably, for certain embodiments, abrasive particles include those that have a hardness of no greater than about 9 Mohs, and more preferably no less than about 6 Mohs. These include, for example, ceria ($CeO_2$), which has a hardness of about 6 Mohs, alumina ($Al_2O_3$), which has a hardness of about 9 Mohs, and silica ($Si_2O_3$), which has a hardness of about 7 Mohs.

For various desired effects, other additives can be included as well for desired effects. These include, but are not limited to, a surfactant (e.g., polyethylene glycol, polyoxy ethylene ether, or polypropylene glycol) to enhance wettability and reduce friction, a thickener (e.g., CARBOPOL) to achieve a desired viscosity, etc. Preferably, the composition is an aqueous solution of these components.

For certain embodiments, the acidic composition includes a plurality of abrasive particles. For other embodiments, the acidic composition is essentially free of abrasive particles when supplied to the interface of the fixed abrasive article and the workpiece surface. However, in these latter embodiments, it is contemplated that planarization is accomplished by one or both of the fixed abrasive article and/or abrasive particles that may be removed from the fixed abrasive article at the fixed abrasive/surface interface in combination with the acidic composition. In any event, abrasive particles are typically not present in the composition as initially applied, i.e., they are not supplied from a source external to the polishing interface.

Various planarization assemblies or units for performing methods of the invention are readily available and are clearly contemplated by the scope of the present invention as described in the accompanying claims. Such planarization assemblies can create an interface between a polishing pad or a fixed abrasive article and the substrate surface (e.g., wafer surface) in various manners, e.g., rotation, movement, pressure, etc., to achieve planarization. An acidic composition is typically introduced at or near the interface, by a variety of methods such as by dripping, spraying, or other dispensing means, or by presoaking a polishing pad, although other locations and methods of introduction can be used.

In a typical planarizing machine, a polishing pad or fixed abrasive article is fixed on a platen or table, a carrier assembly that includes a substrate holder to support the substrate (e.g., wafer) typically using suction, and a drive assembly to rotate and/or reciprocate the platen and/or a drive assembly to rotate and/or translate the substrate holder during planarization. Thus, conventional planarizing machines rotate the carrier assembly, the polishing pad or fixed abrasive article, or both the carrier assembly and the polishing pad or fixed abrasive article. In general, the planarizing machines are used to produce a planarization reaction product at the surface of a substrate whose hardness is less than the hardness of the abrasive particles and whose adhesion to the substrate is less than the original surface material; and to remove the reaction produce using the abrasive particles.

Typically, the polishing pads, with or without abrasive particles embedded therein, are disk-shaped and rotatable about a fixed plane and axis at constant or variable speeds. Typically, the speed of rotation ranges from about 2 revolutions per minute (rpm) to about 200 rpm.

Typically, a polishing pad is presoaked and continually rewet with the acidic composition. If the polishing pad does not include abrasive particles embedded therein, the acidic composition includes abrasive particles, which is then referred to as an abrasive slurry. The acidic composition may be applied to the interface between a polishing pad and a substrate surface using a variety of techniques. For example, the component parts of the composition may be applied separately and mixed at the interface or immediately before contacting the interface. The acidic composition can be applied by pumping it through the pad. Alternatively, it can be applied at the leading edge of the pad, although this may not provide uniform distribution of the acidic composition across the surface being planarized, which is desirable.

The polishing pad can be any of a wide variety of conventional polishing pads that are used with abrasive slurries. They can be made from a material such as polyurethane, polyester, acrylic, acrylic ester copolymers, polytetrafluoroethylene, polypropylene, polyethylene, cellulose, cellulose esters, polyamides, polyimides, polysiloxane, polycarbonates, epoxides, phenolic resins, etc. They include, for example, a polyurethane-based foam material, wherein the foam cell walls of the pad aid in removal of reaction products at the wafer surface and the pores within the pad assist in supplying slurry to the pad/wafer interface. They can include convex or concave features, which can be formed by embossing a surface pattern. For example, a polishing pad can have continuous grooves in concentric ellipses in the surface of the pad for more uniform slurry delivery and more effective debris removal. Commercially available polishing pads can be obtained under the trade designations "URII," "Sycamore," and "Polytex" from Rodel, Phoenix, Ariz. Examples of polishing pads are also disclosed in U.S. Pat. No. 6,039,633 (Chopra).

In general, a fixed abrasive includes a plurality of abrasive particles dispersed within a binder that forms a three-dimensional fixed abrasive element that is adhered to one surface of a backing material. They are described, for example, in U.S. Pat. No. 5,692,950 (Rutherford, et al.) and International Patent Publication WO 98/06541. Commercially available fixed abrasive articles can be obtained from Tokyo Sumitsu Kageki and Ebera Corporation, both of Japan, and Minnesota Mining and Manufacturing Company (3M Company) of St. Paul, Minn. An example of a preferred fixed abrasive article is a ceria-based pad commercially available from 3M Company under the trade designation "SWR 159." Such fixed abrasive articles can be used with a acidic composition as described herein with or without abrasive particles in the acidic composition.

It is highly desirable to have a high polishing rate (i.e., the rate at which material is removed from the substrate) to reduce the duration of each planarizing cycle. Furthermore, it is highly desirable for the polishing rate to be uniform across the substrate to produce a uniformly planar surface. Preferably, the polishing rate is controlled to provide accurate, reproducible results. Also, preferably, the planarization process is carried out in one cycle (i.e., one step). That is, for the removal of any material from a particular surface, there is only one planarization cycle without any intervening rinse cycles. This planarization process is then typically followed by a post-planarization clean process in which abrasive particles are not used.

The figures provide further information about the methods of the invention. FIG. 1A illustrates one portion of a wafer 10 prior to planarization or etching in accordance with the present invention. The wafer portion 10 includes a substrate assembly 12 having junctions 16 formed thereon. Isolation areas can also be formed on substrate assembly 12 having a patterned dielectric layer, e.g., an interlayer dielectric material, formed thereon that can be used, for example, in the formation of an interconnect structure. The patterned dielectric layer may be formed of any layer providing electrical isolation between metal regions. For example, such a dielectric material may be a patterned oxide layer, e.g., silicon dioxide or TEOS (tetraethyl orthosilicate).

Figure 1B:
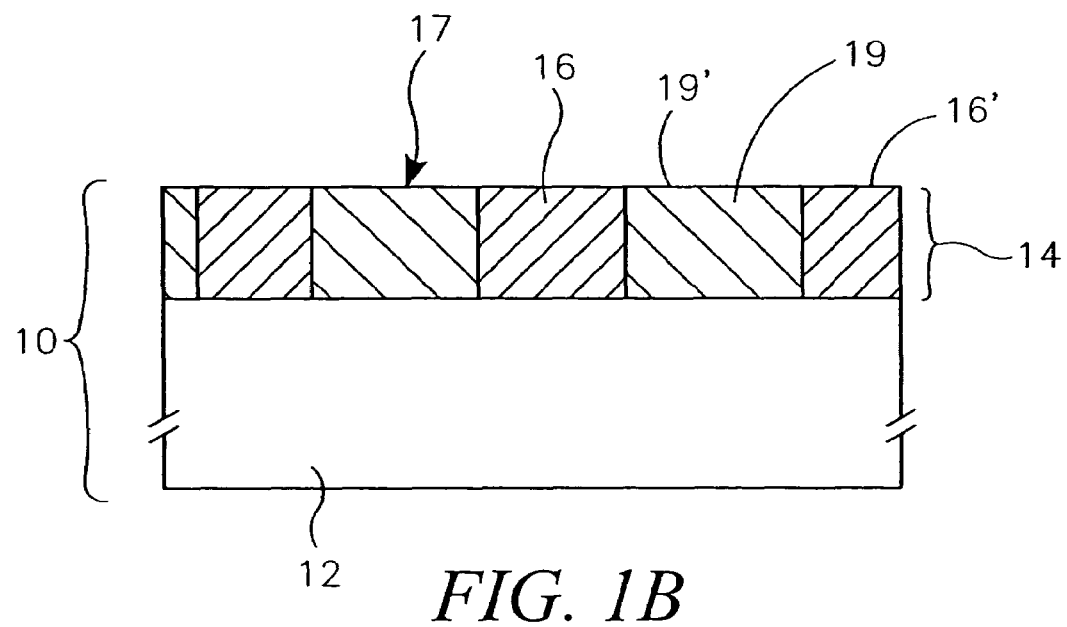

An interconnect material 19 is then formed over the substrate assembly 12 and the patterned dielectric layer 16. The interconnect material 19 may be any conductive material such as platinum or any other suitable conductive Group VIII metal-containing interconnect material. Generally, as shown in FIG. 1A, the nonplanar upper surface 13 of interconnect layer 19 is subjected to planarization or etching in accordance with the present invention. Preferably, planarization is carried out such that the resulting wafer 10, as shown in FIG. 1B, includes an upper surface 17 planarized so the thickness of the wafer 10 is substantially uniform across the entire wafer 10. As a result, the wafer now includes electrically conductive regions 19, isolated within the patterned dielectric material 16 forming an interconnect layer 14, e.g., the conductive lines of the interconnect structure is separated by dielectric material.

Further, as shown in FIG. 1B, the upper surface 17 of the interconnect layer 14 includes both dielectric material surface regions 16' and conductive surface regions 19' such that no conductive material 19 remains over the patterned dielectric layer 16.

FIG. 1A is shown only to illustrate a surface having nonuniformities, such as height differences, in the fabrication of semiconductor devices. The present invention is not limited to use with nonplanar surfaces, such as that shown in FIG. 1A. The present invention is also beneficial for use with substantially planar surfaces. For example, the methods in accordance with the present invention are beneficial during the whole planarization process, even at the end of the process when the surface being planarized is in a substantially planar state. Furthermore, the methods in accordance with the present invention are beneficial during etching processes, including damascene-type etching processes.

The following examples are offered to further illustrate the various specific and preferred embodiments and techniques. It should be understood, however, that many variations and modifications may be made while remaining within the scope of the present invention.

EXAMPLES

For removing 100% platinum, a typical method involves immersing a workpiece with platinum thereon in a composition of $H_3PO_4$:$H_2SO_4$:$HCl$:$HNO_3$ in relative amounts of about 25:25:50:8 by volume at 80° C. A typical etch rate is about 600 Angstroms per minute.

For removing 60/40 Pt/Rh, a typical method involves immersing a workpiece with Pt/Rh thereon in a composition of $H_3PO_4$:$H_2SO_4$:$HCl$:$HNO_3$ in relative amounts of about 25:25:50:0.5 by volume at 80° C. A typical etch rate is about 400 Angstroms per minute.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A method of removing Group VIII metal-containing material from a surface of a substrate, the method comprising contacting the Group VIII metal-containing material with a mixture of concentrated acids without additional added water, the mixture comprising concentrated phosphoric acid initially in an amount of at least about 10 vol-% and no greater than about 25 vol-%, concentrated sulfuric acid initially in an amount of at least about 10 vol-% and no greater than about 50 vol-%, concentrated nitric acid initially in an amount of at least about 0.25 vol-% and no greater than about 10 vol-%, and concentrated hydrochloric acid initially in an amount of at least about 25 vol-% and no greater than about 50 vol-%, wherein contacting comprises contacting the Group VIII metal-containing material with the acidic composition at a temperature of at least about 65° C.

2. The method of claim 1 wherein contacting comprises contacting the Group VIII metal-containing material with the mixture of concentrated acids at a temperature of no greater than about 100° C.

3. The method of claim 1 wherein contacting comprises contacting the Group VIII metal-containing material with the mixture of concentrated acids at a temperature of at least about 80° C.

4. The method of claim 3 wherein contacting comprises contacting the Group VIII metal-containing material with the mixture of concentrated acids at a temperature of no greater than about 100° C.

5. The method of claim 1 wherein the substrate is a semiconductor substrate or substrate assembly.

6. The method of claim 5 wherein the semiconductor substrate or substrate assembly is a wafer.

7. The method of claim 1 wherein contacting the Group VIII metal-containing material with the mixture of concentrated acids comprises immersing the substrate in the acidic composition.

8. The method of claim 1 wherein contacting the Group VIII metal-containing material with the mixture of concentrated acids comprises spraying the substrate with the acidic composition.

9. The method of claim 1 wherein contacting the Group VIII metal-containing material with the mixture of concentrated acids comprises:
positioning the Group VIII metal-containing surface of the substrate to interface with a polishing pad;
supplying the mixture of concentrated acids in proximity to the interface; and
planarizing the substrate surface.

10. The method of claim 9 wherein the mixture of concentrated acids comprises a plurality of abrasive particles.

11. The method of claim 9 wherein the polishing pad comprises a plurality of abrasive particles.

12. A method of removing elemental platinum from a surface of a substrate, the method comprising contacting the elemental platinum with a mixture of concentrated acids without additional added water, the mixture comprising concentrated phosphoric acid, concentrated sulfuric acid, concentrated nitric acid, and concentrated hydrochloric acid, wherein the etch rate upon immersion in the acidic composition is at about 600 Angstroms per minute, and wherein the surface of the substrate consists essentially of elemental platinum.

13. The method of claim 12 wherein contacting comprises contacting the elemental platinum with the mixture of concentrated acids at a temperature of at least about 65° C.

14. The method of claim 13 wherein contacting comprises contacting the elemental platinum with the mixture of coneentrated acids at a temperature of no greater than about 100° C.

15. The method of claim 13 wherein contacting comprises contacting the elemental platinum with the mixture of concentrated acids at a temperature of at least about 80° C.

16. The method of claim 15 wherein contacting comprises contacting the elemental platinum with the mixture of concentrated acids at a temperature of no greater than about 100° C.

17. The method of claim 12 wherein the concentrated phosphoric acid is initially in an amount of at least about 10 vol-% and no greater than about 25 vol-%, the concentrated sulfuric acid is initially in an amount of at least about 10 vol-% and no greater than about 50 vol-%, the concentrated nitric acid is initially in an amount of at least about 0.25 vol-% and no greater than about 10 vol-%, and the concentrated hydrochloric acid is initially in an amount of at least about 25 vol-% and no greater than about 50 vol-%.

18. The method of claim 17 wherein contacting comprises contacting the elemental platinum with the mixture of concentrated acids at a temperature of at least about 65° C.

19. The method of claim 18 wherein contacting comprises contacting the elemental platinum with the mixture of concentrated acids at a temperature of no greater than about 100° C.

20. The method of claim 18 wherein contacting comprises contacting the elemental platinum with the mixture of concentrated acids at a temperature of at least about 80° C.

21. The method of claim 20 wherein contacting comprises contacting the elemental platinum with the mixture of concentrated acids at a temperature of no greater than about 100° C.

22. A method of removing platinum-rhodium alloy-containing material from a surface of a substrate, the method comprising contacting the platinum-rhodium alloy-containing material with a mixture of concentrated acids without additional added water, the mixture comprising concentrated phosphoric acid, concentrated sulfuric acid, concentrated nitric acid, and concentrated hydrochloric acid, wherein the etch rate upon immersion in the acidic composition is about 400 Angstroms per minute, and wherein the surface of the substrate consists essentially of a platinum-rhodium alloy.

23. The method of claim 22 wherein the platinum-rhodium alloy-containing material comprises at least about 60 atomic percent platinum and no greater than about 40 atomic percent rhodium.

24. The method of claim 22 wherein contacting comprises contacting the platinum-rhodium alloy-containing material with the mixture of concentrated acids at a temperature of at least about 65° C.

25. The method of claim 24 wherein contacting comprises contacting the platinum-rhodium alloy-containing material with the mixture of concentrated acids at a temperature of no greater than about 100° C.

26. The method of claim 24 wherein contacting comprises contacting the platinum-rhodium alloy-containing material with the mixture of concentrated acids at a temperature of at least about 80° C.

27. The method of claim 26 wherein contacting comprises contacting the platinum-rhodium alloy-containing material with the mixture of concentrated acids at a temperature of no greater than about 100° C.

28. The method of claim 22 wherein the concentrated phosphoric acid is initially in an amount of at least about 10 vol-% and no greater than about 25 vol-%, the concentrated sulfuric acid is initially in an amount of at least about 10 vol-% and no greater than about 50 vol-%, the concentrated nitric acid is initially in an amount of at least about 0.25 vol-% and no greater than about 10 vol-%, and the concentrated hydrochloric acid is initially in an amount of at least about 25 vol-% and no greater than about 50 vol-%.

29. The method of claim 28 wherein contacting comprises contacting the platinum-rhodium alloy-containing material with the mixture of concentrated acids at a temperature of at least about 65° C.

30. The method of claim 29 wherein contacting comprises contacting the platinum-rhodium alloy-containing material with the mixture of concentrated acids at a temperature of no greater than about 100° C.

31. The method of claim 29 wherein contacting comprises contacting the platinum-rhodium alloy-containing material with the mixture of concentrated acids at a temperature of at least about 80° C.

32. The method of claim 31 wherein contacting comprises contacting the platinum-rhodium alloy-containing material with the mixture of concentrated acids at a temperature of no greater than about 100° C.

* * * * *